United States Patent
Shenoy et al.

(10) Patent No.: US 6,397,169 B1
(45) Date of Patent: May 28, 2002

(54) ADAPTIVE CELL SEPARATION AND CIRCUIT CHANGES DRIVEN BY MAXIMUM CAPACITANCE RULES

(75) Inventors: Narendra V. Shenoy, Milpitas; Hi-Keung Ma, Fremont; Mahesh A. Iyer, Sunnyvale, all of CA (US); Robert F. Damiano, Lake Oswego; Kevin M. Harer, Beaverton, both of OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/109,988

(22) Filed: Jun. 30, 1998

(51) Int. Cl.[7] .............................. G06F 17/50; G06F 9/45
(52) U.S. Cl. .............................. 703/14; 703/15; 703/19; 716/9; 716/10; 716/12
(58) Field of Search .............................. 703/13, 14, 15, 703/16, 17, 19, 3, 20; 716/5, 9, 10, 12, 13, 2, 6, 7, 8

(56) References Cited

U.S. PATENT DOCUMENTS

| 5,282,148 A | * | 1/1994 | Poirot et al. ................. | 364/491 |
| 5,446,674 A | * | 8/1995 | Ikeda et al. ................. | 395/500.06 |
| 5,452,239 A | * | 9/1995 | Dai et al. ................. | 395/500.4 |
| 5,459,673 A | * | 10/1995 | Carmean et al. ............ | 364/489 |
| 5,495,419 A | * | 2/1996 | Rostoker et al. ........ | 364/468.28 |

(List continued on next page.)

OTHER PUBLICATIONS

"Modifying the Netlist After Placement for Performance Improvement", Ginetti et al., Custom Integrated Circuits Conference, 1993 IEEE.*
"Post Placement Buffer Reoptimization", Brasen et al., 1992, IEEE.*
"Modeling and Extraction of Interconnect Capacitances for Multilayer VLSI Circuits", Arora et al., 1996, IEEE.*
"A Cell–Based Datapath Synthesizer for ASICs", Ginetti et al., 1993 IEEE.*
"Hierarchical Extraction of 3D Interconnect Capacitances in Large Regular VLSI Structures", van Genderen et al., 1993 IEEE.*
"Symbolic Generation of Constrained Random Logic Cells", Costa et al., 1991 IEEE.*
"Cross–Talk and Ringing on a Multilayer PCB", Poltz et al., 1989 IEEE.*
"Fast Parasitic Extraction for Substrate Coupling in Mixed Signal Ics", Verghese et al., IEEE 1995 Custom Integrated Circuits Conference, 1995 IEEE.*
"PECS: A Peak Current and Power Simulator for CMOS Combinational Circuits", Lam et al., 1996 IEEE.*
Jon Frankle, Xilinx, Inc.; *Iterative and Adaptive Slack Allocation for Performance–Driven Layout and FPGA Routing* ;2100 Logic Drive, San Jose, CA 95124.

Primary Examiner—Kevin J. Teska
Assistant Examiner—W. D. Thomson
(74) Attorney, Agent, or Firm—Wagner Murabito & Hao LLP

(57) ABSTRACT

A process for synthesis and rough placement of an IC design. Initially, a synthesis tool is used to generate a netlist according to HDL, user constraint, and technology data. Each of the wires of the netlist is initially assigned a unit weight. Thereupon, a cell separation process assigns (x,y) locations to each of the cells based on the weights. The wires are then examined to determine their respective performance characteristics. The wires are iteratively re-weighted, and the cells moved according to the new weightings. Next, the cell location information is supplied to the synthesis tool, which can then make changes to the netlist thereto. In the present invention, the size of each of the gates can be either scaled up or down accordingly. Again, the nets are iteratively examined and their weights are adjusted appropriately. The cells are spaced apart according to the new weights.

18 Claims, 6 Drawing Sheets

U.S. PATENT DOCUMENTS

| | | | | |
|---|---|---|---|---|
| 5,544,066 A | * | 8/1996 | Rostoker et al. | 364/489 |
| 5,557,531 A | * | 9/1996 | Rostoker et al. | 364/489 |
| 5,557,533 A | * | 9/1996 | Koford et al. | 706/13 |
| 5,572,436 A | * | 11/1996 | Dangelo et al. | 364/489 |
| 5,598,344 A | * | 1/1997 | Dangelo et al. | 364/489 |
| 5,629,860 A | * | 5/1997 | Jones et al. | 364/490 |
| 5,638,291 A | * | 6/1997 | Li et al. | 395/500.19 |
| 5,666,290 A | * | 9/1997 | Li et al. | 364/491 |
| 5,687,088 A | * | 11/1997 | Tomita | 364/491 |
| 5,790,841 A | * | 8/1998 | Scherer et al. | 713/503 |
| 5,799,170 A | * | 8/1998 | Drumm et al. | 395/500 |
| 5,812,740 A | * | 9/1998 | Scepanovic et al. | 706/45 |
| 5,875,117 A | * | 2/1999 | Jones et al. | 364/491 |
| 5,880,967 A | * | 3/1999 | Jyu et al. | 395/500.07 |
| 5,953,236 A | * | 9/1999 | Hossain et al. | 395/500.09 |
| 5,956,497 A | * | 9/1999 | Ratzel et al. | 395/500.02 |
| 5,974,245 A | * | 10/1999 | Li et al. | 395/500.11 |
| 5,974,247 A | * | 10/1999 | Yonezawa | 395/500.4 |

* cited by examiner

400

ADAPTIVE CELL SEPARATION AND CIRCUIT CHANGES DRIVEN BY MAXIMUM CAPACITANCE RULES

FIELD OF THE INVENTION

The present invention relates to a method for adaptively placing cells and changing the circuit during the synthesis process of an integrated circuit design.

BACKGROUND OF THE INVENTION

A highly specialized field, commonly referred to as "electronic design automation" (EDA), has evolved to handle the demanding and complicated task of designing semiconductor chips. In EDA, computers are extensively used to automate the design process. Computers are ideally suited to performing tasks associated with the design process because computers can be programmed to reduce or decompose large, complicated circuits into a multitude of much simpler functions. Thereupon, the computers can be programmed to iteratively solve these much simpler functions. Indeed, it has now come to the point where the design process has become so overwhelming that the next generation of integrated circuit (IC) chips cannot be designed without the help of computer-aided design (CAD) systems.

Typically, the design process begins with an engineer conceiving and defining the performance specification of the new IC chip. A high level language is used to translate this specification into functional criteria which are fed into a logic synthesis program. Based thereon, the synthesis program generates a netlist containing a collection of gates or cells in terms of a particular semiconductor technology (e.g., very large scale integration—VLSI). This netlist can be regarded as a template for the realization of the physical embodiment of the integrated circuit in terms of transistors, routing resources, etc. Next, a physical design tool is used to place and route the IC chip. It determines the physical pinouts, wiring, interconnections and specific layout of the semiconductor chip. Once the physical layout is complete, the IC chip can be fabricated.

As a software tool, synthesis is often used to predict performance characteristics by estimating the capacitances associated with wires in the design. The capacitance at a wire is based on historical data derived from statistical samplings of the average or typical capacitances experienced for similar wires in previous designs. Once the wires and their associated capacitances are known, mathematical models can be constructed to predict the circuit's behavior. For example, a typical tool can be used to check the chip's timing.

In the past, when semiconductor chips were simpler and less complex, the synthesis tool was able to predict the performance characteristics fairly accurately. However, advances in semiconductor technology have led the way towards more versatile, powerful, and faster integrated circuit (IC) chips. The trend is towards even larger, more complex and sophisticated IC chips in an effort to meet and improve upon the demands imposed by state-of-the-art performance. Today, a single IC chip can contain upwards of millions of transistors. As the complexity, functionality, and size of these chips increase, it is becoming a much more difficult task to estimate the capacitances associated with the multitudes of wires. The accuracies of the performance predictions have been seriously degraded.

Thus there is a need for some method which can be used to more accurately predict the performance of a synthesized design. The present invention provides a solution, whereby the synthesis and rough placement functions are combined into an integrated framework. With the present invention, the placement adapts to changes made to the netlist (e.g., creation, addition, modification, and deletion of nets and/or cells). Two mechanisms, cell separation and device sizing, are adaptively controlled to achieve convergence between the synthesis estimate and the extraction estimate after full place and route.

SUMMARY OF THE INVENTION

The present invention pertains to a process for the synthesis and rough placement of an IC design. Initially, a synthesis tool is used to generate a netlist according to HDL, user constraint, and technology data and physical constraints. Each of the wires of the netlist is initially assigned a unit weight. Thereupon, a rough placement process is performed consistent with physical constraints, whereby cells are assigned (x,y) locations according to the weights of each of the wires. Based on this rough placement process, wire lengths can be determined. The capacitance at each wire is then determined as a function of the wire length and the load capacitance(s) associated with that wire. Consequently, the performance of the design can be calculated based on the wire capacitances. The weights of the wires are then adjusted which causes the cells to be spaced apart according to the new weightings. A number of iterations are performed to adjust the weights and cell spacing in order to improve performance characteristics. In conjunction with adjusting the weight, the present invention also scales up/down the size of one or more of the gates. After a gate is scaled up/down, the wires are then iteratively examined; their weights are adjusted appropriately; and the cells are spaced apart according to the new weights. This entire process of wire weight examination/adjustment, cell separation, and gate sizing is repeated until no further improvements are forthcoming or until a pre-designated number of iterations have been completed.

BRIEF DESCRIPTION OF THE DRAWINGS

The operation of this invention can be best visualized by reference to the drawings.

DETAILED DESCRIPTION

A method for the physical placement of an IC chip which is adaptive to changes in the netlist is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention. U.S. patent application Ser. No. 08/866,625, filed Jul. 1, 1997 entitled, "A Method for the Physical Placement of an Integrated Circuit Aptive to Netlist Changes" by Shenoy et al. and assigned to the assignee of the present invention is incorporated herein by reference.

Figure 1:
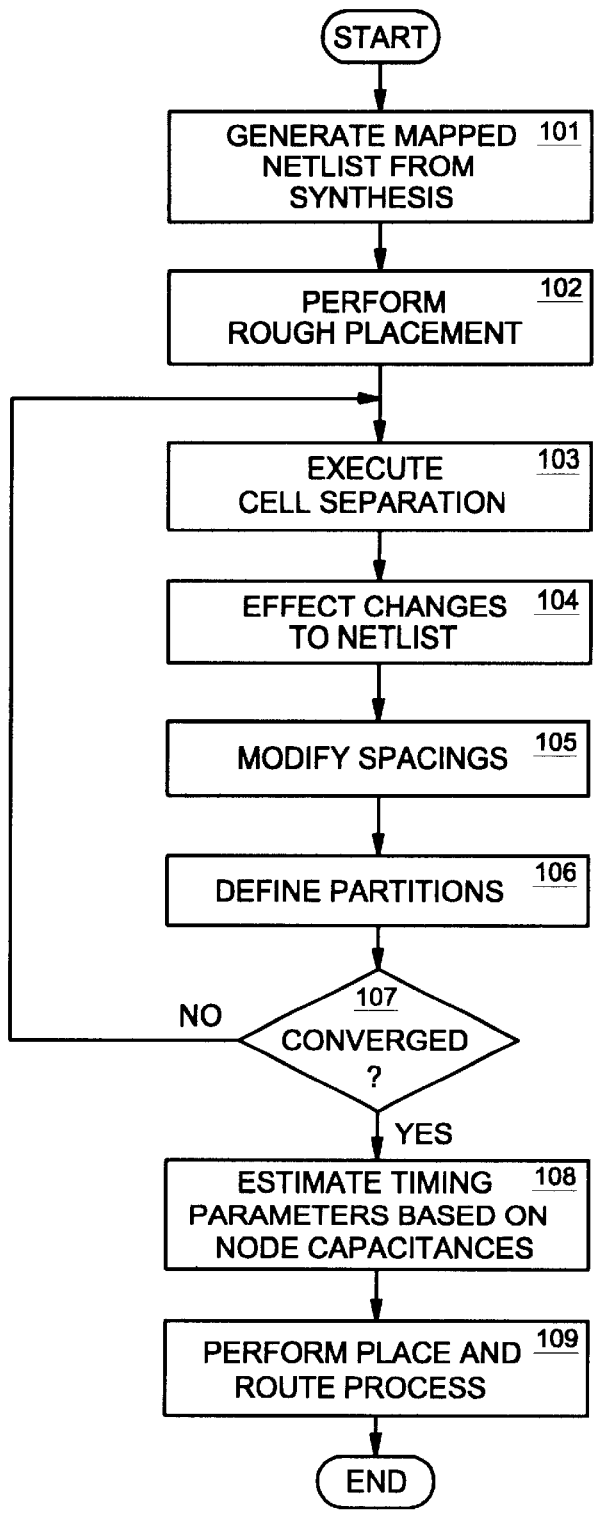
FIG. 1 is a flowchart describing the steps for performing the rough placement process whereby changes to the netlist are taken into account.

FIG. 1 is a flowchart describing the steps for performing the rough placement process whereby changes to the netlist are taken into account. Initially, a synthesis tool is used to generate a mapped netlist, step 101. For each gate in a "mapped" netlist, there exists a corresponding gate defined in the synthesis library. It should be noted that there exist many different types of synthesis tools which can be used to perform step 101. For instance, any of the synthesis tools commercially available from Synopsys, and other EDA software manufacturers, can be used to generate the mapped netlist. (See S. Devadas et al., "Logic Synthesis," McGraw Hill Series on Computer Engineering, 1994; R. Brayton et al., "MIS: A Multiple-Level Logic Optimization System," IEEE Transactions on Computer Aided Design of Integrated Circuits, pp. 1062–1081, 1987). Based on this mapped netlist, a rough placement process is initiated in steps 102–105.

The next five steps 103–107 are performed during the rough placement process. In step 103, cell separation is executed. The cell separation process takes each cell in the netlist and assigns a pair of (x,y) coordinates. These coordinates are used to specify the location of each cell relative to a two-dimensional boundary area in which the circuit is to be placed. Next, changes to the netlist are allowed to occur, step 104. For example, current cells can be modified (e.g., gates can be sized up or down; inverters can be added or deleted; new buffers can be added or deleted, etc.), new cells can be added, old cells can be deleted, current wires can be modified, new wires can be added, and old wires can be deleted. In the present invention, these changes are primarily instigated in response to how the cells are placed. With submicron technology, it is rather difficult to accurately perform the initial synthesis because it is not known where the cells will ultimately be placed. Hence, a best estimate guess is used to perform the synthesis. Now, after cell separation is performed, the netlist is tweaked to optimize the design. For example, buffers may be added to increase the speed of a critical path. Inserting these buffers may cause the area to increase. In the past, the area in which the IC is to be placed was typically held constant. In contrast, the present invention allows the area to change in size (i.e., either grow or shrink). Should the area grow to exceed a predefined allocation, the present invention will automatically generate a message to indicate this condition to the user. The next step 105 involves changing the spacings. The spacings of the circuit placement are allowed to change in response to certain design criteria, such as minimization of cell density, thermal dissipation, power consumption, noise and crosstalk susceptibility, clock routes, critical paths, etc. Furthermore, the spacings can change if the routing area had changed. Thereupon, in step 106, the partitions are defined. Partitioning refers to the process of subdividing the cells in order to better "spread" them apart. An existing partition (e.g., in the shape of a rectangle) is broken into two roughly equal sizes by drawing either a horizontal or vertical line through the approximate midpoint. In step 107, a determination is made as to whether the current placement has successfully converged. Convergence is achieved when each of the partitions reaches a pre-determined size in terms of number of gates. For example, the user can set the convergence point to occur whenever each of the partitions is comprised of less than twenty gates. If convergence has not been reached, steps 103–106 are repeated. Otherwise, once convergence has been achieved, timing parameters can be estimated based on the wire capacitances, step 108.

In the currently preferred embodiment, two mechanisms are adaptively controlled to achieve the improved timing estimate found in step 108. The first mechanism entails adaptively weighting each wire in step 103. The wires are initially assigned unit weights. The wires are then individually examined and their respective weightings are modified, if necessary. The cells are then separated or spaced apart according to the assigned weightings. This process is repeated for a given number of iterations. The second mechanism is to adaptively control the size of each of the gates in step 104. The size of a gate effects its ability to drive its load. Hence, the size of a specific gate can be increased in order to improve performance for the effected logic. Conversely, a gate may be scaled down in size in order to lessen the load that it imposes on a prior gate. Simply adjusting just one or the other of these two mechanisms will improve the timing estimates. However, it has been discovered that adjusting both of these mechanisms will result in much greater degree of timing accuracy.

Figure 2:
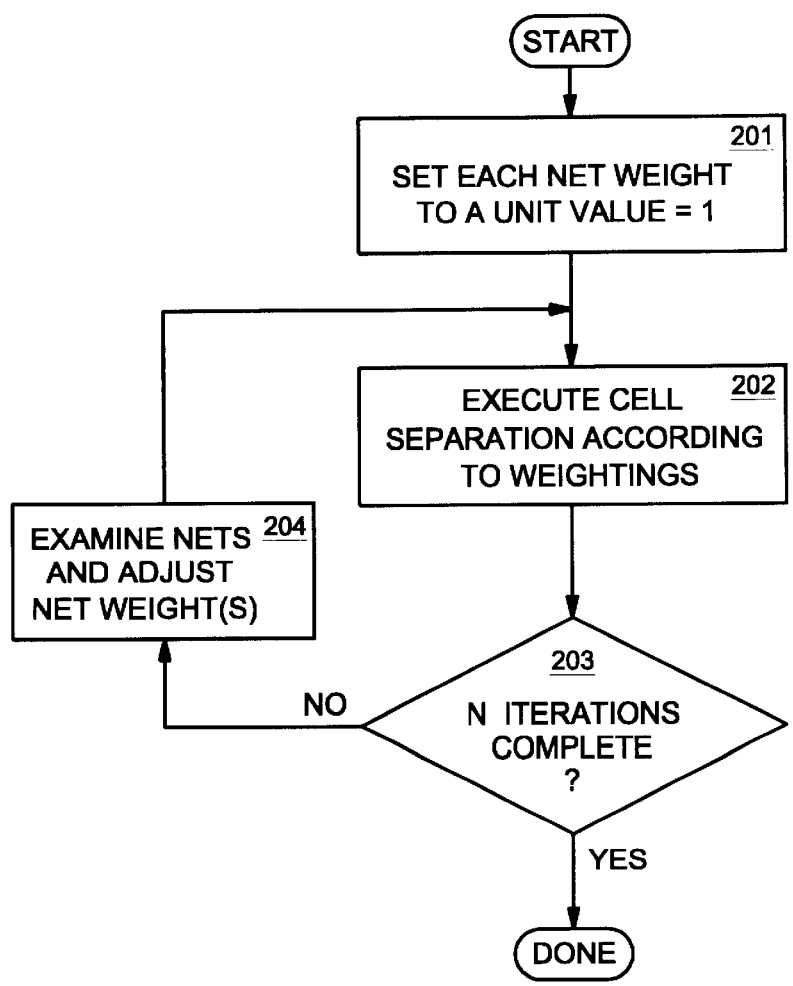
FIG. 2 is a flow chart describing the steps for adaptively controlling cell separation according to the currently preferred embodiment of the present invention.

FIG. 2 is a flow chart describing the steps for adaptively controlling cell separation according to the currently preferred embodiment of the present invention. Initially, each of the nets are assigned a unit weight of one, step 201. Next, the cells are separated according to the respective weightings, step 202. Step 203 determines whether N iterations have been completed. In the currently preferred embodiment, N is set to five. Hence five iterations of steps 201–204 are performed. In general, the greater the number of iterations that are performed, the longer it takes but with improved separation until no further improvements can be achieved. If the number of iterations has completed, the process is done. Otherwise, the nets are individually examined to determine whether its weight is to be adjusted, step 204. Adjusting the weights favors one net over other net(s). For example, if one net in particular is adversely affecting the speed of the chip, that net could be assigned a higher weighting. The cell separation, step 202, spaces the cells apart according to the weightings. Hence, the net with the higher weight would have its wire lengths shortened. All wires have an inherent capacitance which is proportional to the wires lengths. By shortening a wire, its inherent capacitance is reduced. This results in better timing characteristics. Shortening one set of wires improves timing for that net, but may cause another net's wires to increase. Thus, several iterations are run in order to attain the best overall balance, step 203. Note that weights can be adjust up or down. In other words, the wire lengths can be lengthened or shortened, depending on the circumstances.

Figure 3:
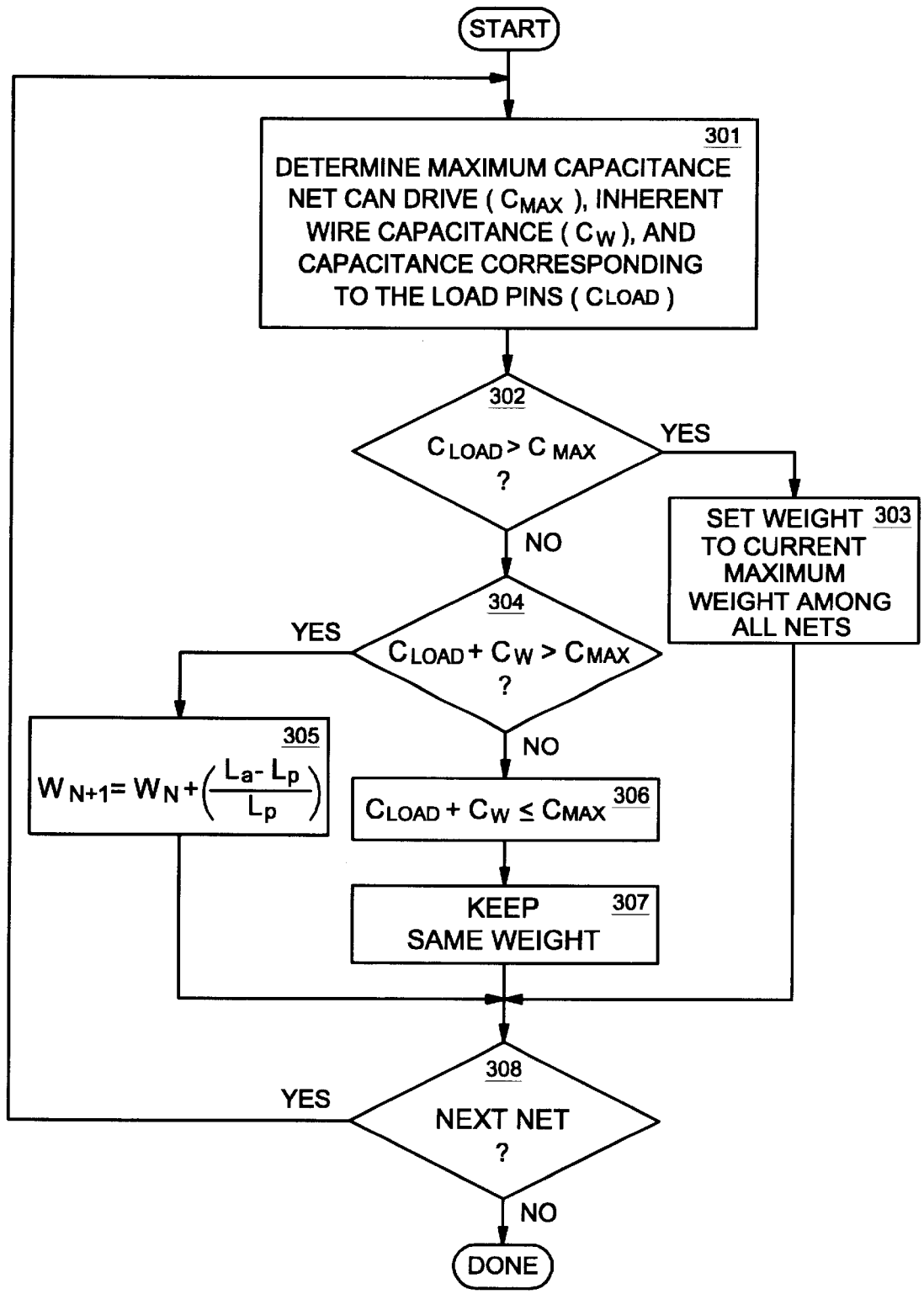
FIG. 3 is a flow chart describing the steps for determining how wire weights are adjusted.

FIG. 3 is a flow chart describing the steps for determining how wire weights are adjusted. Initially, the maximum capacitance ($C_{max}$) that can be driven by the driver gate of the wire is determined, step 301. $C_{max}$ may be obtained as an electrical constraint from the characteristics of the transistor drives the wire. Alternatively it could be budgeted by an algorithm such as a variant of the Zero Slack Algorithm (see Hauge P. S. et al., in proceedings of the International Conference on computer aided design "Circuit Placement for Predictable Performance," 1987). Also, the inherent capacitance associated with the wire length ($C_w$) and the capacitance corresponding to the pin loads ($C_{load}$) are determined as well in step 301. A determination is made in step 302 as to whether the maximum capacitive load that the wire can effectively drive minus the actual capacitive load associated with the pins is less than zero, step 302. If the result is less than zero, this indicates a design violation, regardless of how the cells are spaced apart. In order to minimize this design violation, the net is assigned a weight. But the weighting is deferred until step 305.

Provided that $C_{load}$ is greater than $C_{max}$, step 303 is executed. Step 303 adjusts the weight for that net. The weight is the maximum of either 1 or an adjusted amount. The weight can be adjusted according to the length of the wire ($l_a$) and a given process parameter ($l_p$). The process parameter represents the maximum length of wire that can be driven by the gate with the given capacitive load. This $l_p$ value is found by dividing the available capacitive budget by a capacitive factor, whereby the capacitive factor is the capacitance per unit length specified for that particular technology. More specifically, the weight is adjusted by an amount equal to $(l_a-l_p)/l_p$. Step 304 causes steps 301–303 to be repeated for all wires. Lastly, in step 305, a default weight is set for those wires which would result in a design violation, as determined in previous step 302. The weight of all wires that answered NO to step 302 are assigned a weight equal to the maximum weight of all the wires.

The other control mechanism which is adaptively changed entails the netlist. This can include operations such as changing the size of gates, buffer/inverter insertion, gate restructuring etc. For sake of this discussion, we restrict attention to gate sizing. If there is a design violation, a gate can be sized up to increase the maximum capacitance that it can effectively drive. Alternatively, a gate can be scaled down in size so as to decrease its capacitive load. This control mechanism is performed in step 104 of FIG. 1. By changing the sizes of the gates, the capacitances will change, which in turn, effects how the wires are to be weighted. Thus, step 103 is executed again after the gates have been appropriately re-sized to re-weight the various wires and to re-execute cell separation according to the new weights. The gate re-sizing and weight re-adjustment control mechanisms interactively affect each other. Consequently, the process involving continuous adjustments of the weighting and applying logic transformation are repeated many times over until no further improvements are forthcoming or until a fixed number of iterations have been performed (e.g., repeat one thousand times). It is the combination of continuously adjusting both of these control mechanisms which allows for improved timing predictions and less design violations.

Figure 4:
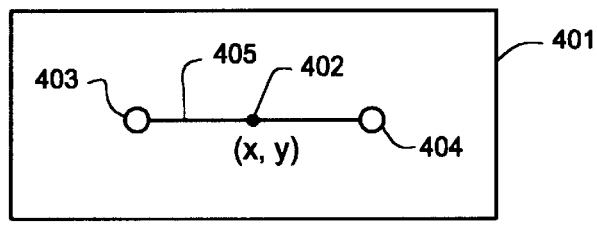
FIG. 4 shows a diagram illustrating an exemplary rough placement process whereby the netlist is allowed to change.
Figure 4:
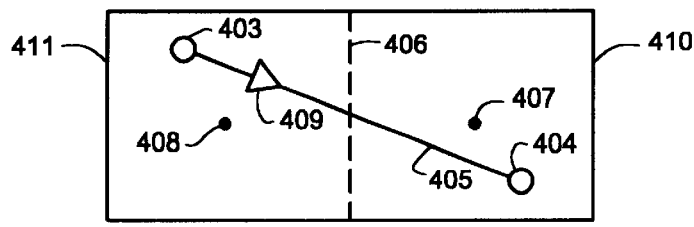
Figure 4:
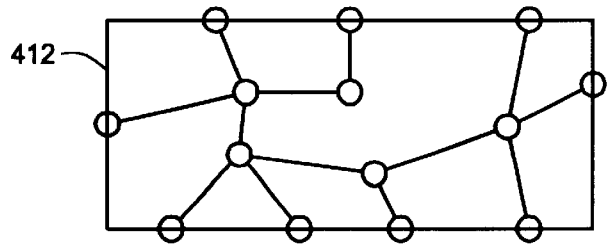
Figure 4:
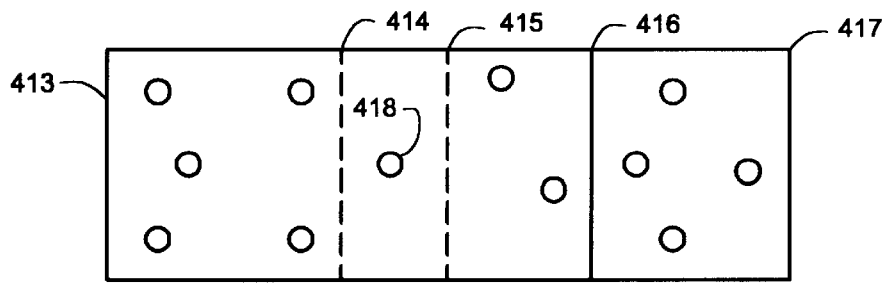
Figure 4:
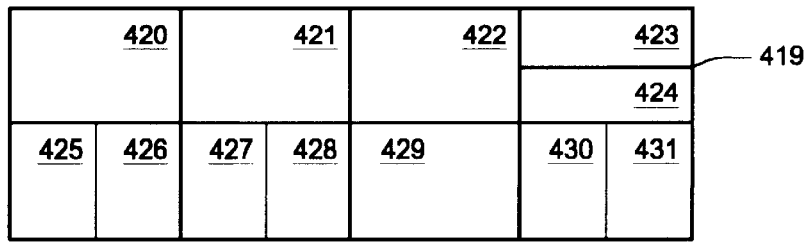

FIG. 4 shows a diagram illustrating an exemplary rough placement process whereby the netlist is allowed to change. Initially, at the first iteration, the total placement area is defined boundary 401 and consists of a single partition. Partition,401 is located according to its center point 402, which has a given (x,y) coordinate. In this example, two cells 402 and 403 are shown. Cell 402 can represent an AND gate while cell 403 can represent an XOR gate. A wire (shown b line 405) connects cell 402 to 403. For instance, the output from the XOR gate can be fed as an input to the AND gate. Next, the single partition 401 is divided into two partitions by drawing a vertical cutline 406 through the midpoint 402. A second iteration is then performed with respect to these two new partitions 410 and 411. Due to the partitioning, the rough placement process may choose to move the location of cells 403 and 404. Moreover, the size of the gates corresponding to cells 403 and 404 may be modified by the synthesis step. For example, if the cells 403 and 404 were moved further apart, cell 403 may have its strength increased in order to properly drive the input to cell 404 (e.g., XOR gate with strength 1 changed to XOR gate with strength 2). If the line 405 becomes too long, a buffer 409 may be inserted to reduce the delay. Inserting a buffer 409 may allow the size of cell 403 to be scaled down.

After M iterations, the number of cells and wires might become quite complex. A representation of just a few cells is shown as 412. It can be seen that the area can become saturated rather quickly. Efficient partitioning can compensate for the increase in cell density. However, there might come a point where there is not enough room to add an additional cell. The total area is allowed to expand in order to accommodate additional nets and/or cells. An example of an expanded area is shown as 413. Expanding the total area affects the partitioning. For example, the location of vertical cutline 414 corresponding to the original area size is now moved to location 415 in order to account for the increase in size as the width of the original boundary 416 is increased by shifting the right boundary to location 417. A change in the partitioning might lead to different placements. For example, prior to enlarging the area, cell 418 belonged to the rightmost partition. After the enlargement, cell 418 now belongs to the leftmost partition. The synthesis tool is then supplied with this additional location information. Based on this new information, the synthesis tool can now generate an improved netlist. The cells are partitioned first into two groups, then into four, then into eight, and so on, until there are only a few cells in each group. The first step of partitioning divides the n cells into two sets of n/2 cells. The number of cells in each side is approximately the same. The area of each half is proportional to the area of the cells included in it. The next step of partitioning is to divide each of these groups in two, this time on the other axis. This process continues until there are only a few cells in each group (e.g., twenty or less). For example, area 419 has been subdivided into twelve separate partitions 420–431. If each of these partitions 420–431 is small enough to meet a particular criteria set by the user, convergence is declared. For each partition, a group of cells and nets are defined. A detailed placement process is then initiated to actually physically place the gates and wires within each of the partitions 420–431. Thereupon a routing process is performed.

Figure 5:
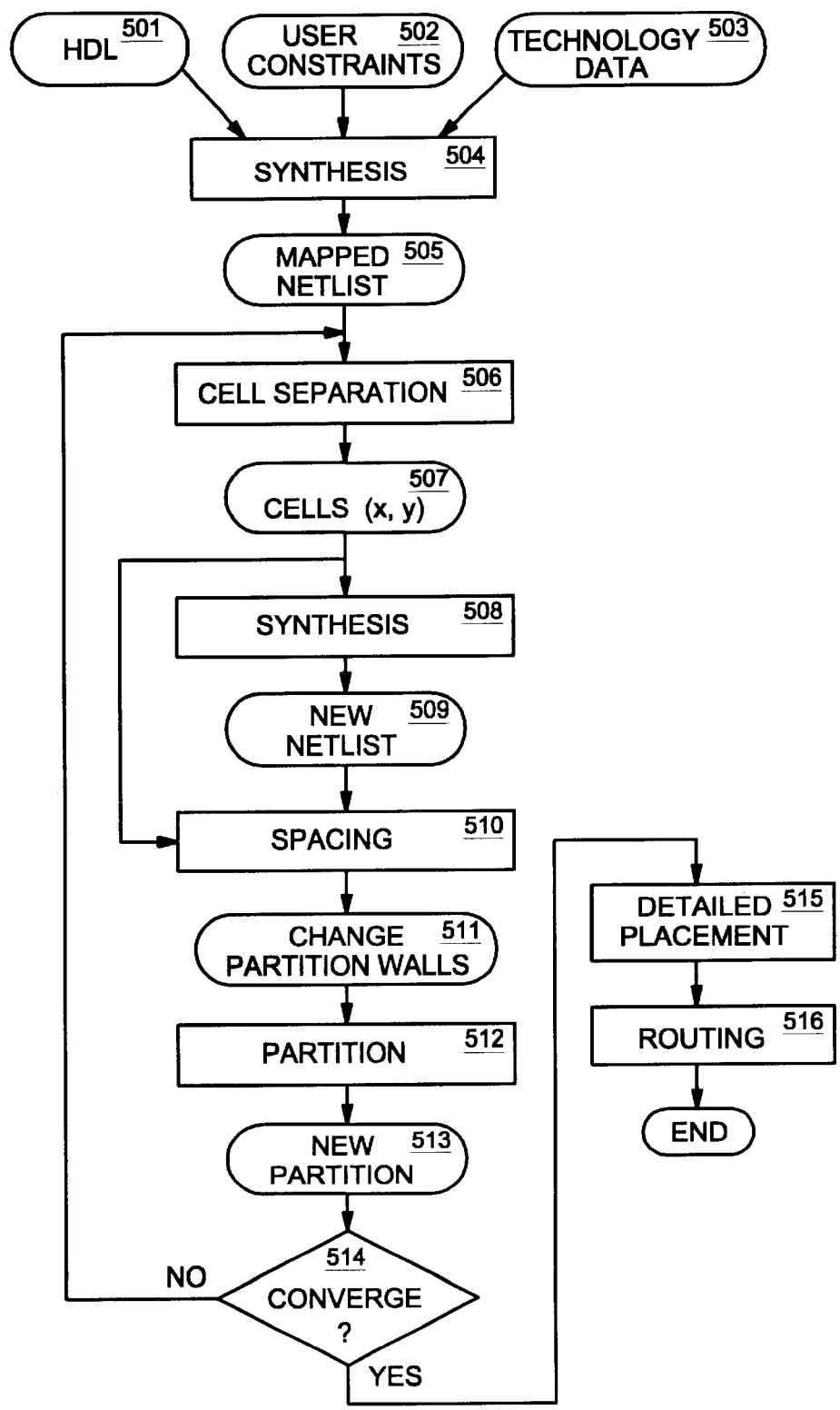
FIG. 5 is a detailed flow diagram describing the inputs, outputs and functions associated with each of the steps of the currently preferred embodiment of the present invention.

FIG. 5 is a detailed flow diagram describing the inputs, outputs and functions associated with each of the steps of the currently preferred embodiment of the present invention. The inputs and outputs are shown in ovals, whereas the process steps are shown in blocks. Initially, the synthesis tool of step 504 accepts as inputs hardware design language (HDL) 501, user constraints 502, and technology data 503. The HDL language format 501 includes special constructs and verification protocols used to develop, analyze, and document a hardware design. The user constraints 502 are constraints specified by the user relating to the chip's performance characteristics (e.g., timing, clock, frequency, power level, skew, delay, etc.). The technology data 503 pertains to the chip's physical attributes, such as a particular architecture (e.g., very large scale integration—VLSI), semiconductor process (e.g., 0.25 micron), specific gate shapes and dimensions which are stored in a library, etc. All of these inputs 501–503 are shaped and selected by the user to customize the chip design. A synthesis tool is then applied in step 504 to refine and generate a mapped netlist 505.

The mapped netlist is input to a cell separator. Cell separation is then performed in step 506 to assign (x,y) coordinates for each cell in the mapped netlist 505. As described above, the task of cell separation is to calculate the positions of the cells. Since the quality of the placement determines the minimal achievable area and wiring length of a circuit, placement has a large impact on production yield and circuit performance. Cell separation tools handle the problem of assigning locations to cells (e.g., objects or elements) so as to minimize some overall cost function. In this area, the cost function is related to the wiring distance between cells. Cells must be assigned locations so that they do not overlap each other, they all fit within some overall bounding figure, and the total wiring cost is minimized. One such method is disclosed in the article by Ren-Song Tsay, Ernest S. Kuh, and Chi-Ping Hsu, PROUD: A Fast Sea-Of-Gates Placement Algorithm, published in the 25th ACM/IEEE Design Automation Conference (1988), paper 22.3. The output from cell separation process 506 is a number of cells, each of which has an assigned (x,y) position 507 denoting the approximate centerpoint of the cell. A subroutine call is made back to the synthesis program with the new cell location information 507. Based on this new cell information, the synthesis program then generates a modified netlist 509. The (x,y) location of the cells 507 and the new netlist 509 are input to a spacing tool. The updated partition wall locations 511 are generated by spacing step 510. Next, the updated partition walls 511 and the new netlist 509 are used to formulate new partitions in step 512. There are a number of different partitioning approaches that can be implemented with the present invention. One approach is disclosed in a paper by Alfred E. Dunlop and Brian W. Kernighan, A Procedure for Placement of Standard-Cell VLSI Circuits, published in the IEEE Transactions on Computer-Aided Design, Vol. CAD-4, No. 1, January 1985. This approach is based on graph partitioning to identify groups of modules that ought to be close to each other, and uses a technique for properly accounting for external connections at each level of partitioning. Other approaches to the partitioning process include min-cut, force-directed, simulated annealing, and spectral approaches. (See for example, M. A. Breuer, Min-Cut Placement, J. Design Automation and Fault Tolerant Computing, 1977).

The resulting new partitions 513 are then examined in step 514 to determine whether convergence has been achieved. If convergence has not been achieved, steps 506–513 are repeated. It should be noted that in some cases, convergence is not possible. If convergence is not reached after some number of iterations, an error message is generated. Once convergence is attained, the rough placement process is complete. The user constraints 502, technology data 503, most recent netlist 509, and cell partition 513 information are input to the detailed placement process 515. Finally, a rough and detailed routing step 516 is executed.

Figure 6:
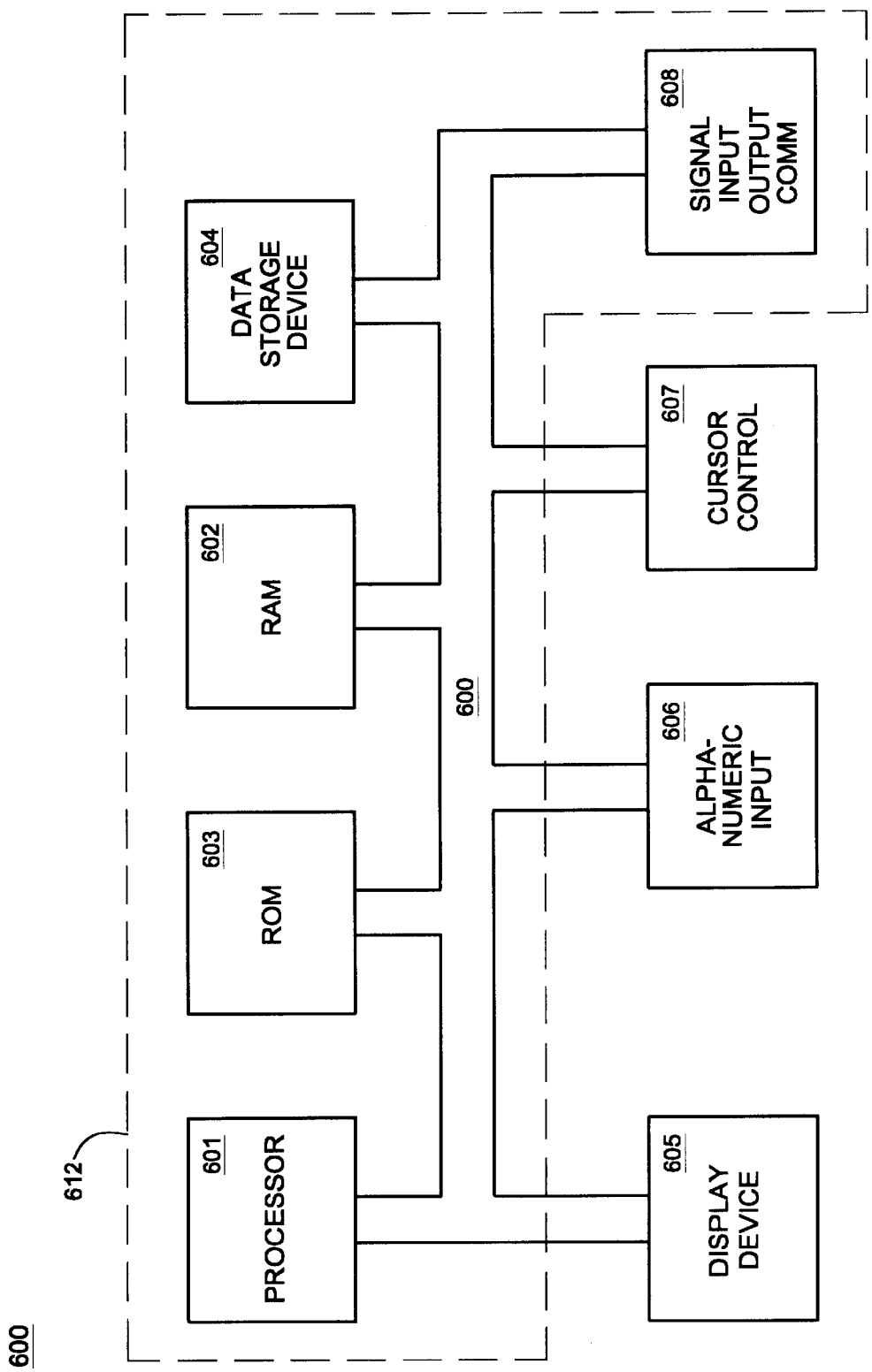
FIG. 6 shows an exemplary computer system 612 upon which the present invention may be practiced.

Referring to FIG. 6, an exemplary computer system 612 upon which the present invention may be practiced is shown. The rough placement procedures responsive to netlist changes are operable within computer system 612. When configured with the rough placement procedures of the present invention, system 612 becomes a computer aided design (CAD) tool 612, for integrated circuit placement. Rough placement procedures described in FIGS. 1 and 5 are implemented within system 612.

In general, computer systems 612 used by the preferred embodiment of the present invention comprise a bus 600 for communicating information, a central processor 601 coupled with the bus for processing information and instructions, a computer readable volatile memory 602 (e.g., random access memory) coupled with the bus 600 for storing information and instructions for the central processor 601. A computer readable read only memory 603 is also coupled with the bus 600 for storing static information and instructions for the processor 601. A data storage device 604 such as a magnetic or optical disk and disk drive coupled with the bus 600 is used for storing information and instructions. A display device 605 coupled to the bus 600 is used for displaying information to the computer user. And an alphanumeric input device 606 including alphanumeric and function keys is coupled to the bus 600 for communicating information and command selections to the central processor 601. A cursor control device 607 is coupled to the bus for communicating user input information and command selections to the central processor 101, and a signal generating device 608 is coupled to the bus 600 for communicating command selections to the processor 601.

The display device 605 of FIG. 6 utilized With the computer system 612 of the present invention may be a liquid crystal device, cathode ray tube, or other display device suitable for creating graphic images and alphanumeric characters recognizable to the user. The cursor control device 607 allows the computer user to dynamically signal the two dimensional movement of a visible symbol (pointer) on a display screen of the display device 605.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for the placement of cells of a logic integrated circuit comprising the steps of:
   a) generating a netlist mapped to an area using a selected semiconductor technology, said netlist comprising a plurality of interconnected cells and associated nets, wherein each of said nets consists of the interconnect wires driven by its associated cell;
   b) assigning a unit weight to each of said nets and establishing a convergence criterion;
   c) performing a rough placement of said cells in accordance with the weights to produce an initial spacing between said cells;
   d) evaluating the wire length associated with a net at the current cell spacing and adjusting the weights, said adjustment being determined from the synthesis library capacitance related parameters associated with said semiconductor technology;
   e) performing a placement of the cells in accordance with the assigned weights
   f) repeating steps d) through e) for a predetermined number of times;
   g) effecting changes to the netlist;
   h) modifying said spacing;
   i) defining partitions;
   j) repeating steps d) through i) until said convergence criterion is met;
   k) estimating timing parameters based upon node capacitances; and
   l) performing a place and route process.

2. The method of claim 1 wherein the area to which said netlist is mapped is increased at least once during the repetition of steps d) through l).

3. The method of claim 1 wherein the area to which said netlist is mapped is decreased at least once during the repetition of steps d) through l).

4. The method of claim 1 wherein at least one gate is resized.

5. The method of claim 1 wherein said synthesis library parameters comprise a maximum load capacitance and a capacitance per unit length.

6. The method of claim 5 wherein said adjustment for the net weight associated with nets for which the sum of load capacitance and wire capacitance do not exceed the maximum capacitance comprises the steps of:
- d1) dividing an available capacitive budget by said capacitance per unit length to give a first result;
- d2) subtracting said first result of step d1) from said wire length to give a second result;
- d3) dividing the second result of step d2) by said wire length to give a third result; and
- d4) adding said third result of step d3) to said weight.

7. A computer-readable medium having stored thereon instructions for causing a computer to implement a placement process comprising the steps of:
- a) generating a netlist mapped to an area using a selected semiconductor technology, said netlist comprising a plurality of interconnected cells and associated nets, wherein each of said nets consists of the interconnect wires driven by its associated cell;
- b) assigning a unit weight to each of said nets and establishing a convergence criterion;
- c) performing an rough placement of said cells in accordance with the weights to produce an initial spacing between said cells;
- d) evaluating the wire length associated with a net at the current cell spacing and adjusting the weights, said adjustment being determined from the synthesis library parameters associated with said semiconductor technology;
- e) performing a placement of the cells in accordance with the assigned weights
- f) repeating steps d) through e) for a predetermined number of times;
- g) effecting changes to the netlist;
- h) modifying said spacing;
- i) defining partitions;
- j) repeating steps d) through i) until said convergence criterion is met;
- k) estimating timing parameters based upon node capacitances; and
- l) performing a place and route process.

8. The method of claim 7 wherein the area to which said netlist is mapped is increased at least once during the repetition of steps d) through l).

9. The method of claim 7 wherein the area to which said netlist is mapped is decreased at least once during the repetition of steps d) through l).

10. The method of claim 7 wherein at least one gate is resized.

11. The method of claim 7 wherein said synthesis library parameters comprise a maximum load capacitance and a capacitance per unit length.

12. The method of claim 11 wherein said adjustment for the net weight associated with nets for which the sum of load capacitance and wire capacitance do not exceed the maximum capacitance comprises the steps of:
- d1) dividing an available capacitive budget by said capacitance per unit length to give a first result;
- d2) subtracting said first result of step d1) from said wire length to give a second result;
- d3) dividing the second result of step d2) by said wire length to give a third result; and
- d4) adding said third result of step d3) to said weight.

13. A computer system having a bus, a memory coupled to the bus for storing instructions, a processor coupled to the bus for processing the instructions comprising the steps of:
- a) generating a netlist mapped to an area using a selected semiconductor technology, said netlist comprising a plurality of interconnected cells and associated nets, wherein each of said nets consists of the interconnect wires driven by its associated cell;
- b) assigning a unit weight to each of said nets and establishing a convergence criterion;
- c) performing an rough placement of said cells in accordance with the weights to produce an initial spacing between said cells;
- d) evaluating the wire length associated with a net at the current cell spacing and adjusting the weights, said adjustment being determined from the synthesis library parameters associated with said semiconductor technology;
- e) performing a placement of the cells in accordance with the assigned weights
- f) repeating steps d) through e) for a predetermined number of times;
- g) effecting changes to the netlist;
- h) modifying said spacing;
- i) defining partitions;
- j) repeating steps d) through i) until said convergence criterion is met;
- k) estimating timing parameters based upon node capacitances; and
- l) performing a place and route process.

14. The method of claim 13 wherein the area to which said netlist is mapped is increased at least once during the repetition of steps d) through l).

15. The method of claim 13 wherein the area to which said netlist is mapped is decreased at least once during the repetition of steps d) through l).

16. The method of claim 13 wherein at least one gate is resized.

17. The method of claim 13 wherein said synthesis library parameters comprise a maximum load capacitance and a capacitance per unit length.

18. The method of claim 17 wherein said adjustment for the net weight associated with nets for which the sum of load capacitance and wire capacitance do not exceed the maximum capacitance comprises the steps of:
- d1) dividing an available capacitive budget by said capacitance per unit length to give a first result;
- d2) subtracting said first result of step d1) from said wire length to give a second result;
- d3) dividing the second result of step d2) by said wire length to give a third result; and
- d4) adding said third result of step d3) to said weight.

* * * * *